United States Patent [19]

Kim

[11] Patent Number: 5,701,126

[45] Date of Patent: Dec. 23, 1997

[54] HIGH SPEED VARIABLE LENGTH DECODER

[75] Inventor: Gyu-Seok Kim, Seoul, Rep. of Korea

[73] Assignee: Daewoo Electronics, Co., Ltd., Seoul, Rep. of Korea

[21] Appl. No.: 560,058

[22] Filed: Nov. 17, 1995

[30]   Foreign Application Priority Data

Nov. 17, 1994 [KR] Rep. of Korea ............. 94-30172

[51] Int. Cl.⁶ .................................................. H03M 7/40
[52] U.S. Cl. ............................. 341/67; 341/65; 341/107
[58] Field of Search ........................ 341/67, 65, 106

[56]   References Cited

U.S. PATENT DOCUMENTS

| | | | |
|---|---|---|---|
| 5,428,356 | 6/1995 | Ozaki | 341/67 |
| 5,491,480 | 2/1996 | Jan et al. | 341/67 |
| 5,550,542 | 8/1996 | Inoue | 341/67 |
| 5,557,271 | 9/1996 | Rim et al. | 341/67 |
| 5,566,192 | 10/1996 | Moon | 371/47.1 |
| 5,572,208 | 11/1996 | Wu | 341/67 |

Primary Examiner—Jeffrey A. Gaffin
Assistant Examiner—Jason L. W. Kost
Attorney, Agent, or Firm—Pennie & Edmonds, LLP

[57]   ABSTRACT

A variable length code decoding apparatus stores a $2^n$-bit variable length coded serial input bit stream, n being a positive integer, and, in response to a control signal, outputs in parallel an objective bit stream having a predetermined number of bits and decodes the objective bit stream from the interface means and outputting a decoded symbol together with its codeword length data. A variable length code decoding apparatus compares the codeword in the objective bit stream and the decoded symbol with the variable length data in the table and generates the control signal.

3 Claims, 3 Drawing Sheets

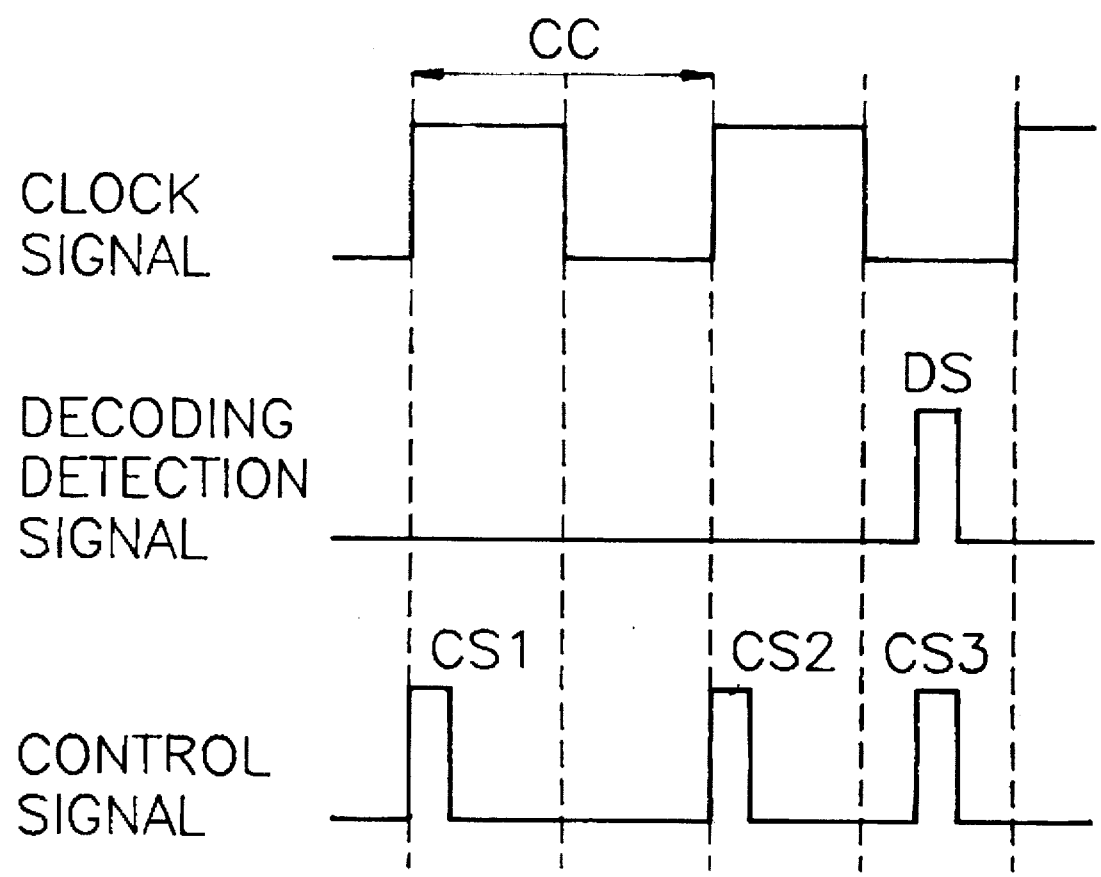

HIGH SPEED VARIABLE LENGTH DECODER

FIELD OF THE INVENTION

The present invention relates to a variable length decoder; and, more particularly, to a high speed variable length decoder which is capable of providing a high speed decoding operation by reducing idle time between codeword decoding process cycles.

DESCRIPTION OF THE PRIOR ART

Variable length coding is a technique often used for effective data compression. This technique is used to convert fixed-length data to variable-length codewords based on the statistical occurrences of the data. The length of the codewords is chosen in such a manner that shorter codewords are used to represent more frequently occurring data and longer codewords are chosen to represent less frequently occurring data. By properly assigning the variable-length codewords to a library of all possible source codewords, the average word length of the variable-length codewords becomes shorter than that of the original data, thereby rendering it possible to achieve an effective data compression.

In this connection, the Huffman code design is a procedure commonly used to construct a minimum redundant variable length code for a known data statistic. In general, the encoding process can be implemented by using a lookup table.

In a digital video system, the data rate is usually very high. Therefore, a primary requirement for a variable length encoder or decoder used in such a system is that such encoding or decoding be carried out at a high speed. To achieve the high speed coding or decoding, it may be desirable to use a technique commonly known as parallel processing. For inputs to a variable length encoder are of fixed length data, it is rather easy to partition them for the parallel encoding thereof.

However, the decoding process is more complicated. Due to the fact that it has a variable length, each codeword has to be segmented from the received bit stream before it can be decoded into a source symbol, which makes it difficult to use the parallel processing technique. Because of this constraint, the input data is normally decoded on a bit-by-bit basis, using what is known as a bit serial decoder.

One of the bit serial decoding apparatus commonly employed to decode a stream of variable length codewords is a VLC decoder employing a tree-searching algorithm such as the one disclosed in U.S. Pat. No. 4,899,149 issued on Feb. 6, 1990 to Gary Kahan. In this device, a variable length code is represented by a tree with codewords as leaves (which are also called terminal nodes). The decoding process starts from the root of the code tree and is guided by the received bit stream to follow one of two branches at each node. When a leaf is reached, the end of a codeword is detected and segmented from the remaining bit stream. This type of decoding apparatus includes a logic circuitry corresponding to the tree and a control circuitry to traverse the code tree. This approach is rather slow, however, especially for long codewords, since a bit-by-bit search through the code tree is required for each decoded symbol.

Another exemplary type of the bit serial decoder is disclosed in U.S. Pat. No. 4,853,696 issued on Aug. 1, 1989 to A. Mukherjee. This bit serial decoder is also implemented through the use of Huffman tree. However, this bit serial decoder fails to meet the high data rate requirement of a video system because its decoding speed is rather low, i.e., only one bit cycle.

Accordingly, it has been felt that some kind of parallel processing is necessary to effectively implement a variable length decoder. One of the proposed techniques is, therefore, to partition the data to be encoded into segments and insert a unique word between each adjacent segment. A unique word means a word that cannot be generated by a combination of the codewords. At the decoder, the unique word is utilized to identify the boundary between adjacent segments. Under the scheme, several variable length decoders are employed to decode a like number of segments simultaneously or in parallel.

Although a high parallelism may be achieved via this architecture, there are several disadvantages. First, a great deal of extra hardware is required. Secondly, a decoder of this type can only be used with an encoder which employs the unique word system. In addition, insertion of the unique word will further compromise the compression efficiency.

As indicated above, one of the difficulties associated with a variable length decoder(VLD) is that the length of an incoming codeword is not known in advance. Once the length of an incoming codeword is known, however, the decoder can begin to decode it with relative ease.

With the above in mind, a parallel structure for a variable length decoder has been disclosed in U.S. Pat. No. 5,225,832 issued on Jul. 6, 1993 to Jinn-Shyan Wang et al.

The VLD disclosed in this article, as shown in FIG. 1, includes an interface circuit 100 having a buffer 101 and a shifter 103, a lookup table memory 150 having a decoder programmable logic array(PLA) 151 and a length PLA 153, and a clock(not shown) which generates a clock signal having a predetermined clock cycle.

As may be seen from FIG. 1, the interface circuit 100 stores temporarily a $2^n$-bit variable length coded serial input bit stream(wherein n is a positive integer) and, at each clock cycle, outputs in parallel an objective bit stream having a predetermined number of bits from the input bit stream. The lookup table memory 150 decodes the objective bit stream from the interface circuit 100 to output a decoded symbol and a codeword length corresponding to the decoded symbol.

The length output from the lookup table memory 150 is fed back to the shifter 120 as a shifter control signal.

The speed of the parallel decoder of FIG. 1 is one codeword per clock cycle. This is much faster than the one bit per clock cycle of the bit serial decoder discussed above. Moreover, the parallel decoder of FIG. 1 does not require use of a unique word to segregate a coded bit stream into segments.

However, although decoding one codeword may take less than one clock cycle, the VLD will stay idle until the beginning of a next clock cycle because the VLD is allowed to decode one codeword per one clock cycle only. This, consequently, tends to impede or deteriorate the operation speed of the VLD.

SUMMARY OF THE INVENTION

It is, therefore, a primary object of the invention to provide a high speed variable length decoder which is capable of providing a high speed decoding operation by reducing idle time between codeword decoding process cycles.

In accordance with the present invention, there is presented a variable length code decoding apparatus comprising: an interface block for storing a $2^n$-bit variable length coded serial input bit stream, n being a positive integer, and, in response to a control signal, outputting in parallel an objective bit stream having a predetermined number of bits; a lookup table memory for decoding the objective bit stream from the interface means and outputting a decoded symbol together with its codeword length data; and a controller for storing a table having variable length data, wherein the variable length data include each codeword and its corresponding decoded symbol, and receiving the objective bit stream from the interface means and the decoded symbol from the lookup table memory means and comparing the codeword in the objective bit stream and the decoded symbol with the variable length data in the table to generate the control signal.

BRIEF DESCRIPTION OF THE DRAWINGS

The above and other objects and features of the present invention will become apparent from the following description of preferred embodiments given in conjunction with the accompanying drawings, in which:

FIG. 3 presents a timing diagram of the clock, decoding detection and control signals.

DETAILED DESCRIPTION OF THE PREFERRED EMBODIMENTS

Figure 1:
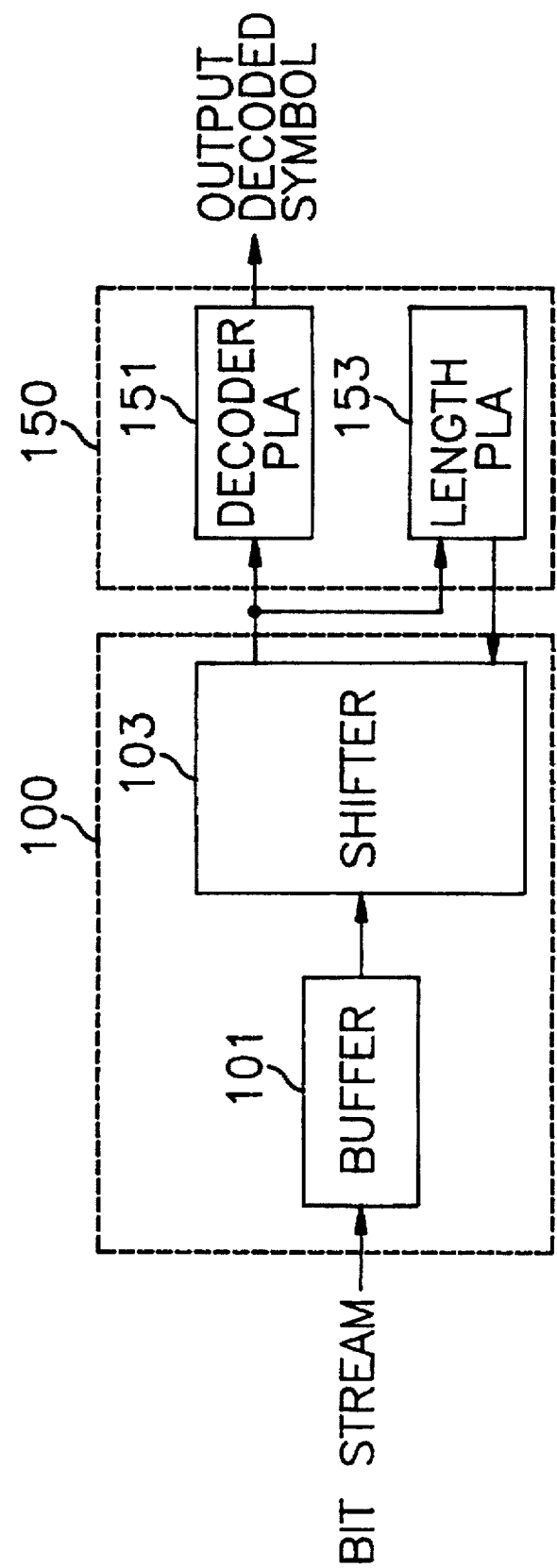
FIG. 1 is a block diagram of a conventional VLC decoding apparatus.
Figure 2:
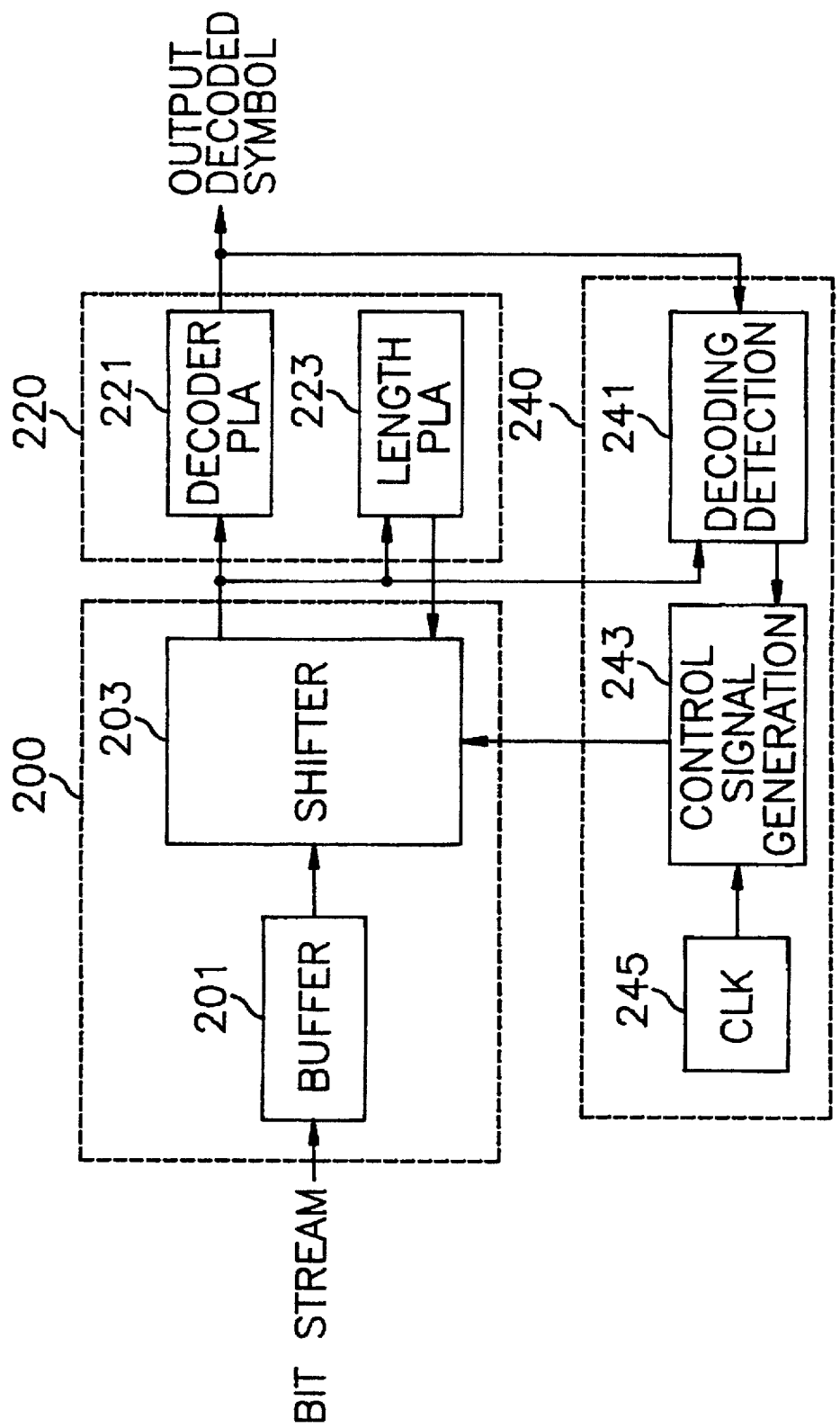
FIG. 2 is a block diagram of a VLC decoding apparatus in accordance with the present invention.

A variable length decoder(VLD) in accordance with the present invention is shown in FIG. 2. The VLD comprises an interface circuit 200, a lookup table memory 220, a control circuit 240.

The interface circuit 200 is adapted to receive and hold a $2^n$-bit variable length coded serial input bit stream(wherein n is a positive integer) and to extract in parallel an objective bit stream having a predetermined number of bits from the input bit stream. For the purpose of illustrating the preferred embodiment, 16-bit data as the objective bit stream is chosen, although data of other lengths may also be applicable. As shown in FIG. 2, the interface circuit 200 includes a buffer 201 and a shifter 203. The lookup table memory 220 includes a decoder PLA 221 and a length PLA 223. In addition, the control circuit 240 includes a decoding detection block 241, a control signal generation block 243 and a clock 245 which generates a clock signal having a predetermined clock cycle.

In the interface circuit 200, the buffer 201 includes two latches(not shown). The number of bit positions in each of the two latches is equal to the longest codeword utilized in the system(e.g., 16 bits), so the two latches together have a total number of bit positions equal to twice the length of the longest codeword in the system(e.g., 32 bits).

The shifter 203 defines a length of a window in the two latches of the buffer 201. Furthermore, the location of this window is variable. The two latches of the buffer 201 are filled with the input bit stream. Initially, the shifter 203 defines a window which is coextensive with the first latch of the buffer 201. In response to a control, e.g., CS1 shown in FIG. 3, signal from the control circuit 240, the shifter 203 provides the 16 bits of the objective bit stream to the lookup table memory 220 and the control circuit 240.

The lookup table memory 220 decodes the objective bit stream fed from the shifter 203 and outputs a decoded symbol and a length of the codeword corresponding to the decoded symbol. As disclosed in Ming-Ting Sun et al., "AN Entropy Coding System for Digital HDTV Applications", *IEEE Transactions on Circuits and System for Video Technology*, 1, No. 1, pp. 147–155 (March, 1991), the lookup table memory 220 may be advantageously implemented in Programmable Logic Arrays(PLAs). In the PLA-based lookup table memory 220, the decoder PLA 221 serves to detect the presence of a particular input codeword in the input objective bit stream to provide the decoded symbol, i.e., a fixed length(e.g., 8-bits) word, corresponding to the codeword. The decoded symbol is fed to an inverse quantizer(not shown) and the control circuit 240. And the length PLA 223 provides the length of each of the detected codeword to the shifter 203.

In response to the control signal, the shifter 203 accumulates the codeword length fed from the length PLA 223. The window defined by the shifter 203 is then shifted to a position offset by the accumulated codeword length and the shifter 203 provides the new objective bit stream to the lookup table memory 220. Therefore, the next codeword to be decoded always starts from the leading bit of the shifter output.

When the accumulated codeword length equals or exceeds 16-bits, the contents of the Second latch are moved into the first latch and new data bits are written into the second latch. The shifter 203 then defines a window which includes the bits now in the first latch which have not been decoded and enough bits from the second latch which totally make 16-bits.

The decoding detection block 241 receives in parallel the objective bit stream of 16 bits from the shifter 203 and the decoded symbol of 8 bits from the decoder PLA 221. Like the lookup table memory 220, the decoding detection block 241 is implemented in Programmable Logic Arrays(PLAs). That is, the decoding detection block 241 has an AND-plane (not shown) and an OR-plane(not shown). A relatively simple codeword having a length(e.g., 12 bits) smaller than the length of the objective bit stream and the decoded symbol corresponding thereto are represented as an entry in the AND-plane according to their bit pattern. When the input bit stream including the objective bit stream and the decoded symbol match an entry in the AND-plane, the OR-plane produces an decoding detection signal that indicates the completion of the decoding of the codeword in the objective bit stream. The control signal generation block 243 receives the clock signal and the decoding detection signal from the decoding detection block 241 and provides the control signal to the shifter 203. Specifically, as shown in FIG. 3, if there is no input of the decoding detection signal during one clock cycle (CC), the control signal generation block 243 generates the control signal, e.g., CS2, at the beginning of the next clock cycle. But, if the decoding detection signal, e.g., DS, is inputted during one clock cycle, the control signal generation block 243 generates the control signal, e.g., CS3, in response to the decoding detection signal.

Therefore, when the decoding of a codeword in the lookup table memory 220 is completed, the inventive VLD can begin to decode the next codeword instantly without any idle time.

While the present invention has been described with respect to the particular embodiments, it will be apparent to those skilled in the art that various changes and modifications may be made without departing from the scope of the invention as defined in the following claims.

What is claimed is:

1. An apparatus for decoding variable length coded codewords, comprising:

interface means for storing a variable length coded serial input bit stream and outputting, in response to a control signal, in parallel an objective bit stream of a predetermined number of bits, the objective bit stream including a codeword;

means for decoding the codeword included in the objective bit stream and outputting a decoded symbol corresponding to the codeword; and control means, storing a table having a plurality of entries, each of the entries including a codeword and its corresponding decoded symbol, for receiving the objective bit stream and the decoded symbol from the decoding means to thereby generate the control signal when the codeword in the objective bit stream and the decoded symbol from the decoding means match a codeword and a decoded symbol included in one of the entries, respectively.

2. The apparatus according to claim 1, wherein said control means includes:

decoding detection means for storing the table having the entries and generating a decoding detection signal if the codeword in the objective bit stream and the decoded symbol from the decoding means match the codeword and the decoded symbol included in said one of the entries, respectively;

means for generating a clock signal; and means for generating the control signal based on the decoding detection signal and the clock signal.

3. The apparatus according to claim 2, wherein said control signal generating means having means for generating the control signal in response to the decoding detection signal if the decoding detection signal is generated during one clock cycle of the clock signal and generating the control signal at the beginning of a next clock cycle of the clock signal if otherwise.

* * * * *